United States Patent
Yang et al.

(10) Patent No.: US 7,491,585 B2
(45) Date of Patent: Feb. 17, 2009

(54) ELECTRICAL FUSE AND METHOD OF MAKING

(75) Inventors: Chih-Chao Yang, Poughkeepsie, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 11/550,943

(22) Filed: Oct. 19, 2006

(65) Prior Publication Data

US 2008/0093703 A1   Apr. 24, 2008

(51) Int. Cl.
*H01L 23/525* (2006.01)
(52) U.S. Cl. ............ 438/132; 438/281; 438/601; 257/E23.149
(58) Field of Classification Search ......... 438/132, 438/215, 281, 333, 601, FOR. 433; 257/E23.149
See application file for complete search history.

(56) References Cited

U.S. PATENT DOCUMENTS

| | | | |
|---|---|---|---|
| 4,536,948 A | 8/1985 | Te Velde et al. | |
| 5,789,795 A | 8/1998 | Sanchez et al. | |
| 5,955,380 A * | 9/1999 | Lee | 438/706 |
| 6,124,194 A | 9/2000 | Shao et al. | |
| 6,251,710 B1 | 6/2001 | Radens et al. | |
| 6,335,228 B1 | 1/2002 | Fuller et al. | |
| 6,555,458 B1 | 4/2003 | Yu | |
| 6,563,188 B2 * | 5/2003 | Nagatani | 257/529 |
| 6,734,525 B2 * | 5/2004 | Chou et al. | 257/529 |
| 6,806,107 B1 * | 10/2004 | Wu | 438/18 |
| 6,879,018 B2 | 4/2005 | Marr et al. | |
| 6,956,783 B2 | 10/2005 | Ikuta et al. | |
| 2001/0004549 A1 * | 6/2001 | Arndt et al. | 438/601 |
| 2001/0031516 A1 * | 10/2001 | Bouldin et al. | 438/132 |
| 2003/0030124 A1 * | 2/2003 | Nagatani | 257/529 |
| 2003/0116820 A1 * | 6/2003 | Daubenspeck et al. | 257/529 |
| 2003/0119293 A1 * | 6/2003 | Bae | 438/601 |
| 2003/0141568 A1 * | 7/2003 | Sato et al. | 257/529 |
| 2004/0209404 A1 | 10/2004 | Wang et al. | |
| 2004/0224431 A1 * | 11/2004 | Wu | 438/17 |
| 2005/0077594 A1 * | 4/2005 | Matsunaga et al. | 257/529 |
| 2005/0078500 A1 | 4/2005 | Poechmueller | |
| 2006/0258122 A1 * | 11/2006 | Whitefield et al. | 438/467 |
| 2007/0007621 A1 * | 1/2007 | Omura et al. | 257/529 |
| 2007/0210412 A1 * | 9/2007 | Booth et al. | 257/529 |
| 2007/0210414 A1 * | 9/2007 | Iwamoto et al. | 257/529 |
| 2007/0247273 A1 * | 10/2007 | Booth et al. | 337/187 |
| 2008/0093703 A1 * | 4/2008 | Yang et al. | 257/529 |

* cited by examiner

*Primary Examiner*—George Fourson
(74) *Attorney, Agent, or Firm*—James J. Cioffi; Greenblum & Bernstein P.L.C.

(57) ABSTRACT

A semiconductor fuse and methods of making the same. The fuse includes a fuse element and a compressive stress liner that reduces the electro-migration resistance of the fuse element. The method includes forming a substrate, forming a trench feature in the substrate, depositing fuse material in the trench feature, depositing compressive stress liner material over the fuse material, and patterning the compressive stress liner material.

1 Claim, 8 Drawing Sheets

ELECTRICAL FUSE AND METHOD OF MAKING

FIELD OF THE INVENTION

The invention generally relates to integrated circuit design and fabrication, and more particularly to semiconductor fuses and methods of making the same.

BACKGROUND OF THE INVENTION

Computers typically include devices that store data, such as memory devices. A first type of memory device is referred to as a programmable read only memory (PROM) device. To render PROM devices programmable, some PROM devices are provided with an electrical connection in the form of a fusible link, which is also typically referred to as a fuse. Such PROM devices may be programmed by selectively blowing (i.e., creating a discontinuity in) fuses to selectively place circuits of the device into or out of electrically conductive contact with one another.

Another type of memory device is referred to as a dynamic random access memory (DRAM) device. DRAM devices may also utilize fuses to provide redundant circuits. As is known in the art, redundancy improves the fabrication yield of high-density semiconductor devices, such as DRAM devices, by making possible the substitution of a redundant program circuit for a failed program circuit that could otherwise render the entire semiconductor device inoperative. The failed circuit may be bypassed (i.e., deactivated) and the redundant circuit programmed (i.e., activated) by selectively blowing fuses of the semiconductor device.

In the past, PROM device programming and DRAM device repairing, as described above, has been accomplished using a laser to selectively blow open fuses. Laser blowing, however, has become increasingly difficult for a number of reasons. First, as semiconductor devices have shrunk in size, fuses have also shrunk, such that fuses are now smaller than the diameter of conventional laser beams. This makes it difficult or impossible to blow a fuse with a laser without inadvertently damaging another part of the fuse or another circuit of the semiconductor device. Second, as semiconductor devices have shrunk in size, the density of fuses (and other circuits) on the devices has increased. However, conventional lasers require excessive silicon space between fuses to avoid damaging neighboring circuits. Lastly, programming or repairing a device by using a laser to blow open thousands of fuses is very time consuming.

As an alternative to using lasers, fuses have been developed that can be blown by supplying a high current to the fuse. These fuses are sometimes referred to as an electrical fuse (e-fuse), and typically have a narrow neck portion between two larger contact regions. Owing primarily to electro-migration effects, voids can be formed inside of metal conductors due to metal ion movement caused by high-density current flow. Because void growth rate is a function of current density and a fuse narrowed neck region with the smallest cross sectional area will experience the highest current density of the fuse, the application of a high enough current across the fuse can cause the neck region of the fuse to blow (i.e., become discontinuous). Thus, by using e-fuses, PROM devices may be programmed and DRAM devices may be repaired by selectively applying elevated current (i.e., programming current) to appropriate fuses.

However, e-fuse generational scaling poses a barrier for such above-described on-chip programming. That is, as the operating voltage of semiconductor devices continues to be scaled down, achieving and controlling sufficiently high programming voltage for blowing fuses becomes increasingly difficult.

Accordingly, there exists a need in the art to overcome the deficiencies and limitations described hereinabove.

SUMMARY OF THE INVENTION

In a first aspect of the invention, there is a fuse comprising a fuse element and a compressive stress material that reduces an electro-migration resistance of the fuse element.

The fuse element may comprise first and second contact portions and a neck connecting the first and second contact portions. The neck has a cross-sectional area less than each of the first and second contact portions.

The compressive stress material may directly contact the neck and the first and second contact portions. Alternatively, the compressive stress material may directly contact the neck while the first and second contact portions are substantially devoid of direct contact with the compressive stress material.

The fuse element may comprise one of silicon, silicon plus metal silicide, copper, copper alloy, aluminum, aluminum alloy, and tungsten. The compressive stress material may comprise one of titanium, titanium nitride, tantalum, tantalum nitride, tungsten, silicon oxide, silicon nitride, silicon carbide, nitrogen-doped silicon carbide, and hydrogen-doped silicon carbide, and have a thickness in the range of about 5 nm to 100 nm.

The fuse may further comprise a second material atop the compressive stress liner. In such a case, the compressive stress material may comprise one of titanium, titanium nitride, tantalum, tantalum nitride, and tungsten, while the second material comprises one of silicon oxide, silicon nitride, silicon carbide, nitrogen-doped silicon carbide, and hydrogen-doped silicon carbide. Alternatively, the compressive stress material may comprise one of silicon oxide, silicon nitride, silicon carbide, nitrogen-doped silicon carbide, and hydrogen-doped silicon carbide, while the second material comprises one of titanium, titanium nitride, tantalum, tantalum nitride, and tungsten.

In a second aspect of the invention, there is a semiconductor device comprising a substrate. The device further comprises a fuse element having first contact portion, a second contact portion, and a neck disposed in the substrate. The device further comprises a compressive stress liner coupled to the fuse element.

In a third aspect of the invention, there a method of making a fuse for a semiconductor device comprising forming a substrate, forming a trench feature in the substrate, and depositing fuse material in the trench feature. The method further comprises depositing compressive stress liner material over the fuse material, and patterning the compressive stress liner material.

In a fourth aspect of the invention, there is a method comprising depositing a fuse material in a trench feature of a substrate, and depositing a liner over the fuse material. The method further comprises adjusting electro-migration resistance of the fuse material by adjusting a compressive stress component of the liner during the depositing of the liner.

In a fifth aspect of the invention, there is a method of programming a memory device comprising reducing an electro-migration resistance of a portion of a fuse element of the memory device by applying a compressive strees liner to the portion of the fuse element. The method further comprises creating an electrical discontinuity in the fuse element by applying a programming current to the portion of the fuse element having the reduced electro-migration resistance.

DETAILED DESCRIPTION OF EMBODIMENTS OF THE INVENTION

The invention is directed to semiconductor fuses and methods of making the same. The invention provides an e-fuse that is highly efficient in that it may be blown with lower programming power. Implementations of the invention comprise an e-fuse element covered with a high compressive stress film. The high compressive stress film degrades electro-migration resistance of the fuse element, thereby expediting the fuse programming process. In this manner, less programming energy and/or shorter programming times are sufficient to open (i.e., blow) the fuse circuit. Accordingly, the invention may be used as a programmable fuse in a semiconductor device.

Figure 1A:
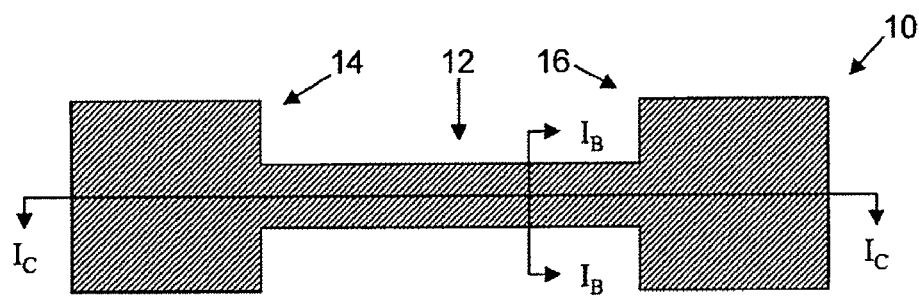
FIGS. 1A through 1C show a fuse according to aspects of the invention.

FIG. 1A shows a top view of a first embodiment of a fuse 10 according to aspects of the invention. The fuse 10 has a conventional "dog-bone" shape, with a narrow neck 12 between larger first and second contact portions 14, 16. Although the portions of the fuse 10 are shown having substantially rectilinear shapes, it is understood that the neck 12 and contact 14, 16 may be of any suitable shape so long as the neck 12 contains a portion having a smaller cross-sectional area than each of the contact portions 14, 16.

Figure 1B:
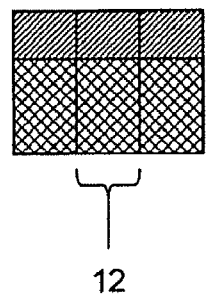

FIG. 1B shows a cross section of the fuse 10 taken along line $I_B$-$I_B$ of FIG. 1A. As is typical with electrical fuses, the neck 12 has a smaller cross sectional area than the contact portions 14, 16. Although the neck is shown having a rectilinear cross-sectional shape, it is understood that other cross-sectional neck shapes may be employed with the invention.

Figure 1C:
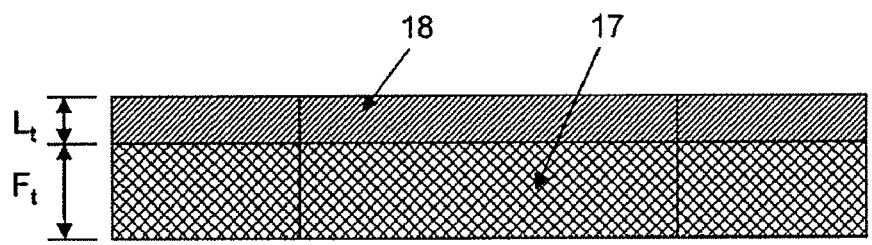

FIG. 1C shows a cross section of the fuse 10 taken along line $I_C$-$I_C$ of FIG. 1A. The fuse 10 comprises a fuse element 17 covered by a liner element 18. The fuse element 17 may be composed of any suitable material, such as, for example, silicon, silicon plus metal silicide, copper, copper alloy, aluminum, aluminum alloy, tungsten, etc. In embodiments, the fuse element 17 has a thickness $F_t$ in the range of about 100 nm to 1000 nm, and preferably has a thickness of about 300 nm to 500 nm. It is understood, however, that other dimensions may be employed within the scope of the invention.

In implementations, the liner element 18 comprises metal material, such as, for example, titanium, titanium nitride, tantalum, tantalum nitride, tungsten, etc. Alternatively, the liner element 18 may comprise dielectric material, such as, for example, silicon oxide, silicon nitride, silicon carbide, and nitrogen and/or hydrogen doped silicon carbide. In embodiments, the liner element 18 has a thickness $L_t$ in the range of about 5 nm to 100 nm, and preferably has a thickness of about 30 nm to 50 nm. Other dimensions may be employed within the scope of the invention. The liner element 18, whether composed of metal or dielectric material, possess a high compressive stress component such that when the liner element 18 is placed into contact with the fuse element 17 it causes the fuse element 17 to experience a degradation of electro-migration resistance. By reducing the electro-migration resistance of the fuse element 17, the high compressive stress liner element 18 causes the fuse element 17 to more easily form voids when exposed to a programming current. In this manner, the fuse 10 may be blown with lower programming currents and/or shorter programming time.

Figure 2A:
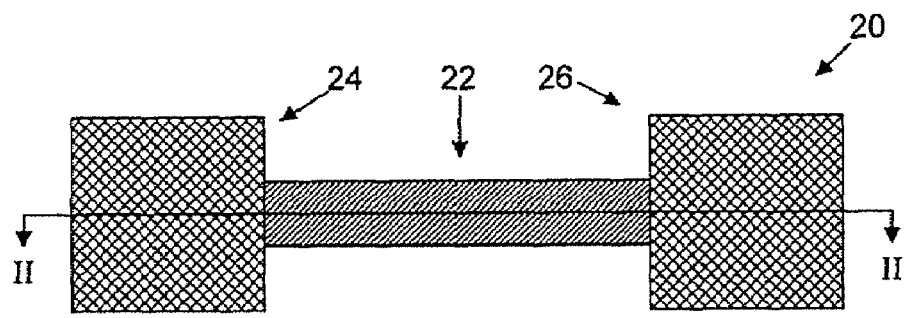
FIGS. 2A and 2B show a fuse according to aspects of the invention.

FIG. 2A shows a top view of another embodiment of a fuse 20 according to aspects of the invention. The fuse 20 has a conventional "dog-bone" shape, with a narrow neck 22 between larger first and second contact potions 24, 26. As described above, fuse 20 may be formed of shapes other than that shown.

Figure 2B:
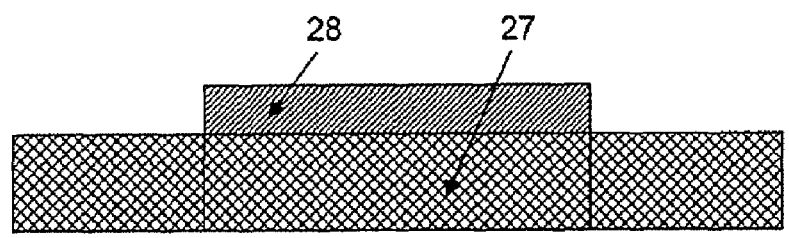

FIG. 2B shows a cross section of the fuse 20 taken along line II-II of FIG. 2A. The fuse 20 comprises a fuse element 27 covered by a liner element 28. The fuse element 27 and liner element 28 may comprise similar materials and thicknesses as those described above. However, unlike liner element 18 described above, liner element 28 substantially only covers the neck 22 of the fuse element 27. Because higher current density occurs at the narrower neck 22 due to the smaller cross sectional area of the neck 22, the liner element 28 in this embodiment is disposed over the neck 22 for decreasing the electro-migration resistance of the material in the neck 22.

Figure 3A:
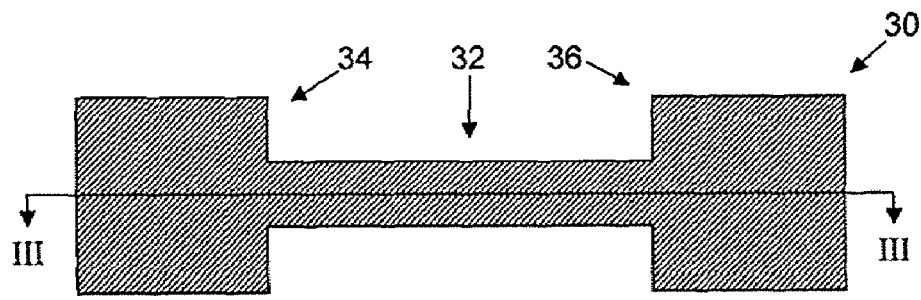
FIGS. 3A and 3B show a fuse according to aspects of the invention.

FIG. 3A shows a top view of another embodiment of a fuse 30 according to aspects of the invention. The fuse 30 has a conventional "dog-bone" shape, with a narrow neck 32 between larger first and second contact potions 34, 36. As described above, fuse 30 may be formed of shapes other than that shown.

Figure 3B:
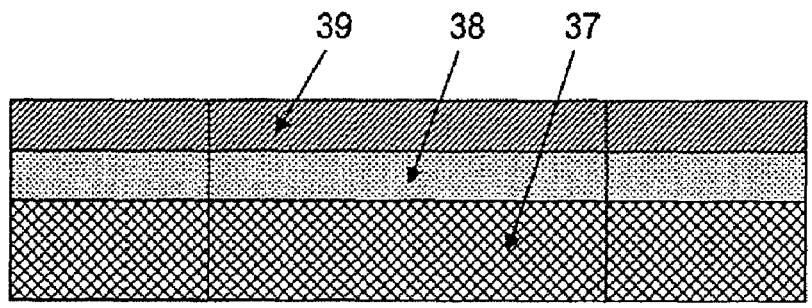

FIG. 3B shows a cross section of the fuse 30 taken along line III-III of FIG. 3A. The fuse 30 comprises a fuse element 37 covered by two liner elements 38, 39. The fuse element 37 may comprise material and thickness similar to that described above with respect to previous embodiments. The first liner element 38 is disposed atop the fuse element, and has a thickness in the range of about 5 nm to 100 nm, and preferably of about 30 nm to 50 nm. The second liner element 39 is disposed atop the first liner element 38, and has a thickness in the range of about 5 nm to 100 nm, and preferably of about 30 nm to 50 nm. Other dimensions are contemplated for use within the scope of the invention.

In embodiments, the first liner element 38 comprises metal or dielectric material, and the second liner element 39 comprises dielectric material or metal, respectively. For example, in a first implementation, the first liner element 38 comprises metal, such as, for example, titanium, titanium nitride, tantalum, tantalum nitride, tungsten, etc., and the second liner element 39 comprises dielectric, such as, for example, silicon oxide, silicon nitride, silicon carbide, and nitrogen and/or hydrogen doped silicon carbide. Alternatively, in another implementation, the first liner element 38 comprises dielectric, such as, for example, silicon oxide, silicon nitride, silicon carbide, and nitrogen and/or hydrogen doped silicon carbide, and the second liner element 39 comprises metal, such as, for example, titanium, titanium nitride, tantalum, tantalum nitride, tungsten, etc.

At least the first liner element 38, which is in contact with the fuse element 37, possesses a high compressive stress component that influences the electro-migration resistance of the fuse element 37. The dielectric, whether it be in the first liner element 38 or the second liner element 39, helps protect the other portions of the fuse 30 from oxidation.

Figure 4A:
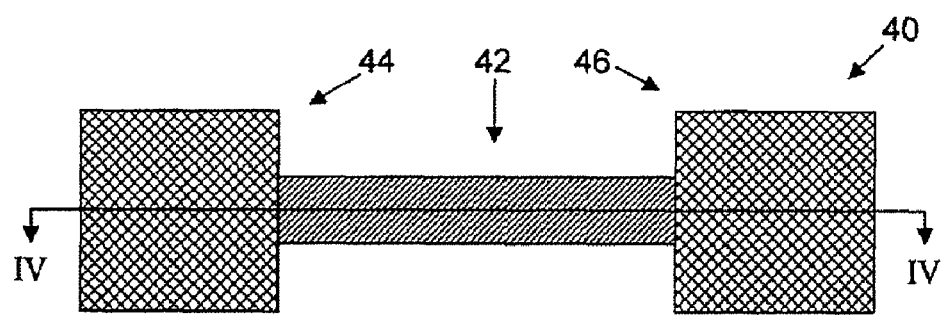
FIGS. 4A and 4B show a fuse according to aspects of the invention.

FIG. 4A shows a top view of another embodiment of a fuse 40 according to aspects of the invention. The fuse 40 has a conventional "dog-bone" shape, with a narrow neck 42 between larger first and second contact potions 44, 46. As described above, the fuse 40 may be formed of shapes other than that shown.

Figure 4B:
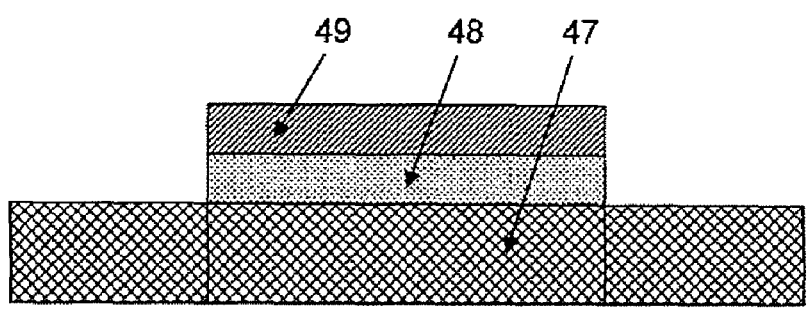

FIG. 4B shows a cross section of the fuse 40 taken along line IV-IV of FIG. 4A. The fuse 40 comprises a fuse element 47, a first liner element 48, and a second liner element 49. The fuse element 47, first liner element 48, and second liner element 49 may comprise similar materials and thicknesses as those described above. As with fuse 20, the first liner element 48, and second liner element 49 substantially only cover the neck 42 of the fuse element 47.

Figure 5A:
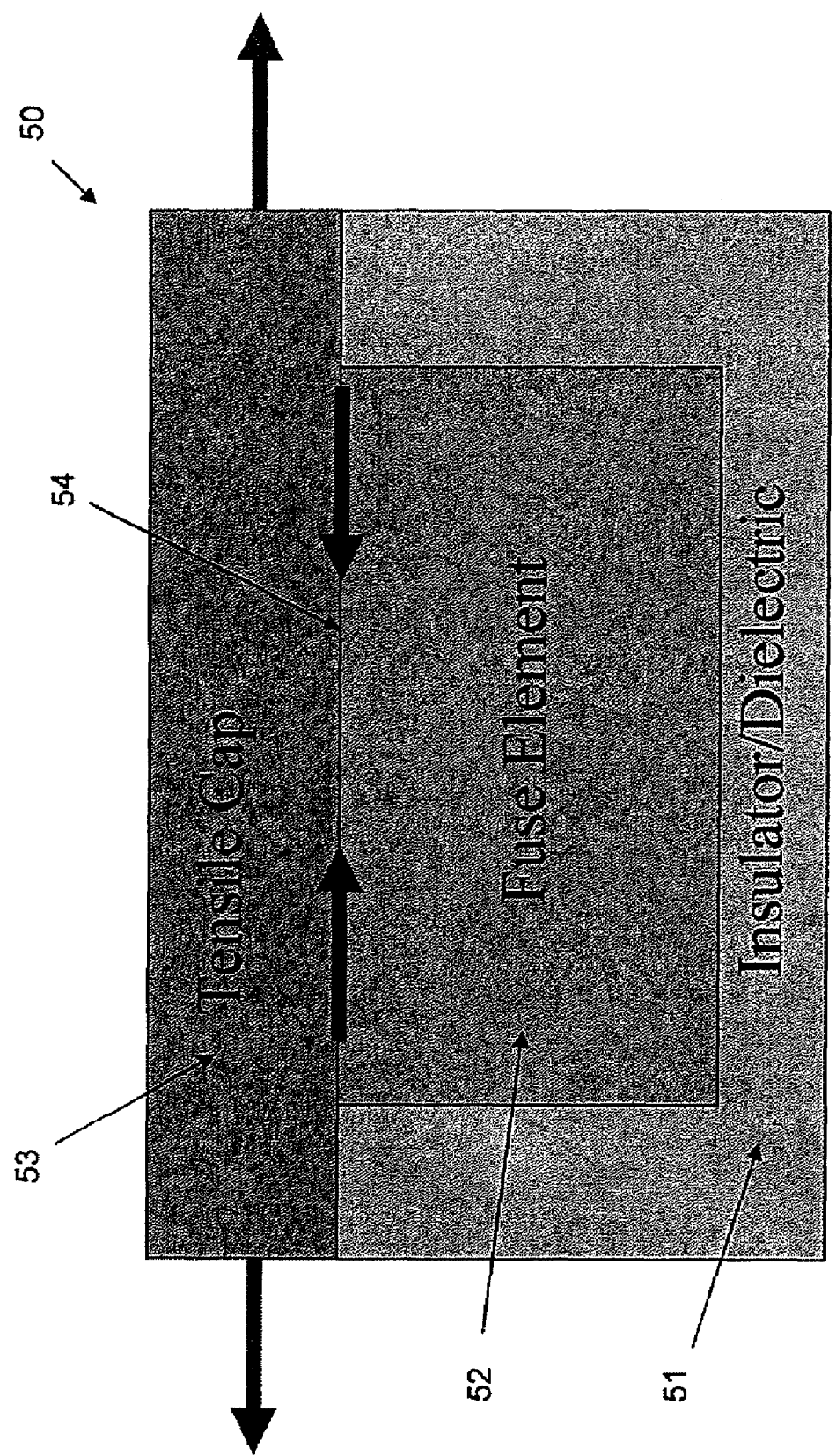
FIGS. 5A and 5B depict stress states of fuses with liners.
Figure 5B:
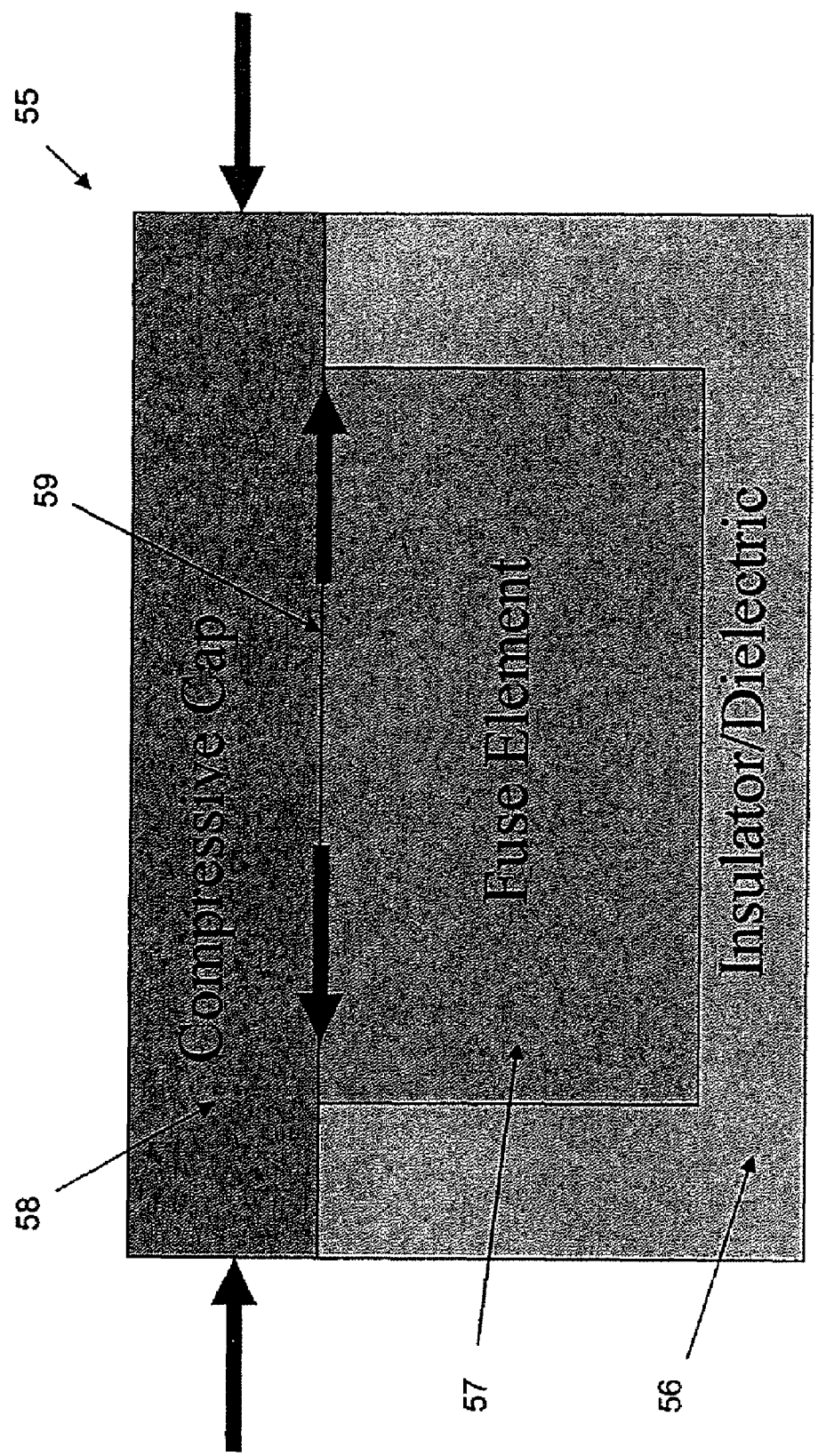

FIGS. 5A and 5B depict a comparison the stresses imposed on the fuse element by tensile and compressive liner elements, the compressive liner element being in accordance with the invention. FIG. 5A shows a cross section of a device 50 comprising a substrate 51 that houses a fuse element 52. A tensile cap 53 (e.g., liner element having tensile stresses) causes compressive stress at the interface 54 with the fuse element 52. Such compressive stress at the fuse element 52 increases the electro-migration resistance of the material of the fuse element 52, thus requiring more energy and/or longer programming time to form voids in the material and blow open the fuse.

Alternatively, as shown in FIG. 5B, a device 55 comprising a substrate 56 and fuse element 57 may be provided with a compressive cap 58 (e.g., compressive liner element). The compressive cap 58 causes tensile stress at the interface 59 with the fuse element 57. Such tensile stress at the fuse element 57 decreases the electro-migration resistance of the material of the fuse element 57, thus less energy and/or shorter programming time is sufficient to form voids in the material and blow open the fuse.

Empirical testing has revealed that the electro-migration resistance of fuse elements with tensile caps may be on the order of about 99 mA/μm to 106 mA/μm, while the electro-migration resistance of fuse elements with compressive caps may be on the order of about 51 mA/μm to 52 mA/μm. This reduced electro-migration resistance of fuse elements with compressive caps allows for the creation of a fuse element that requires less programming energy and/or shorter programming time to create voids and blow open the fuse.

Figure 6:
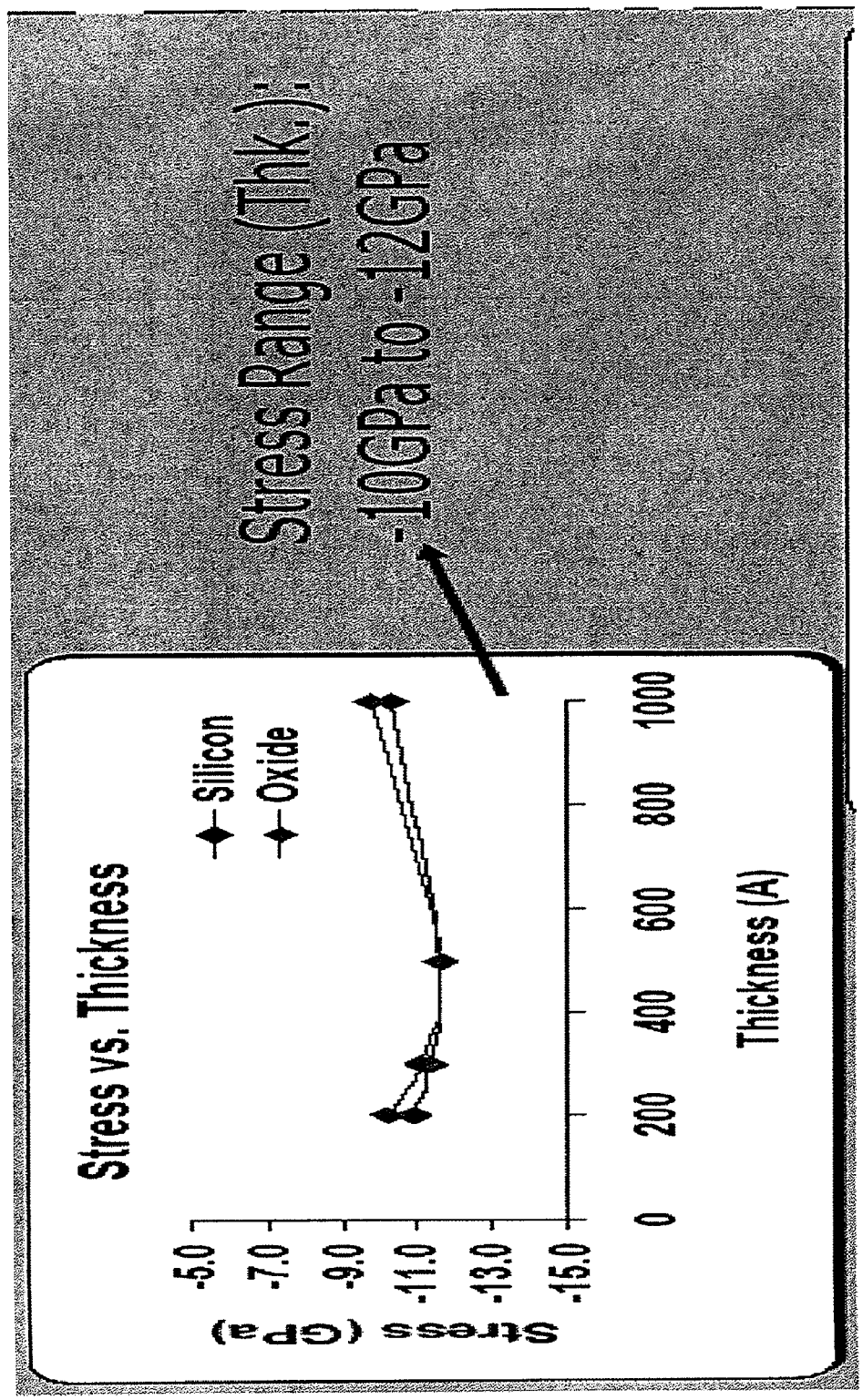
FIG. 6 shows a plot of data of stress versus liner thickness.

FIG. 6 depicts a plot of empirical data of the stress imposed on the fuse element versus the thickness of a compressive cap (e.g., compressive liner element). The plot shows a silicon implementation and an oxide-based implementation of the invention, with thicknesses ranging from about 200 Å (angstroms) to 1000 Å. As seen in FIG. 6, stresses in the range of about −10 GPa to −12 GPa are attainable using implementations of the invention. For example, an oxide-based implementation with a thickness of about 500 Å can result in stress of about −12 GPa. Such stress greatly reduces the electro-migration resistance of a fuse element, thereby allowing for the creation of a fuse element that requires less programming energy and/or shorter programming time to create voids and blow open the fuse.

Figure 7A:
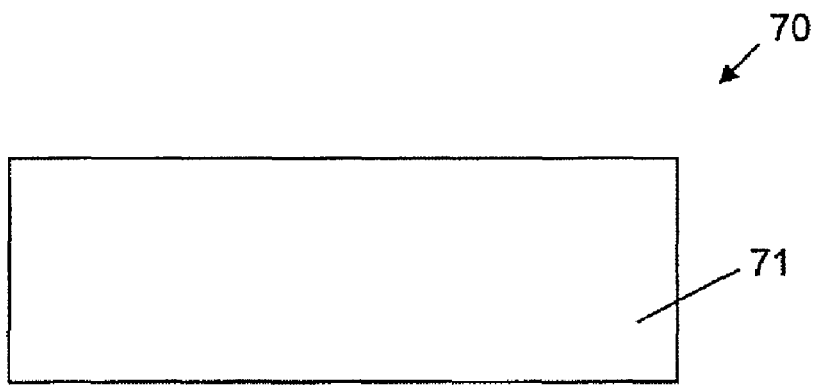
FIGS. 7A through 7F show a method of making a fuse according to aspects of the invention.
Figure 7B:
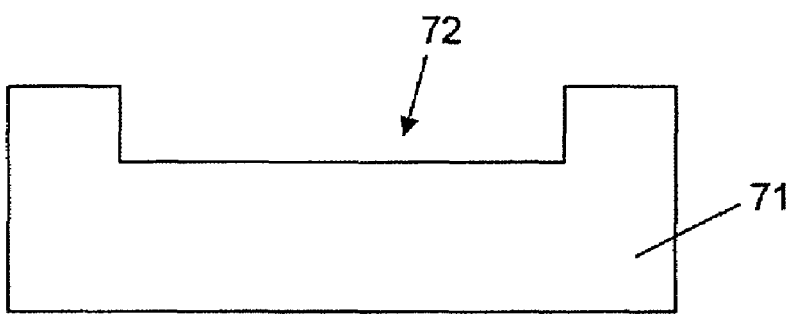

FIGS. 7A through 7F show steps of a method of making a device 70 according to embodiments of the invention. In FIG. 7A, a substrate 71 is provided, as in known in the art. The substrate 71 may comprise a dielectric/insulator such as, for example, SiCOH, SiLK, $SiO_2$, $Si_3N_4$, etc. As shown in FIG. 7B, a trench feature 72 is formed in the substrate 71. The trench feature 72 may be formed in any known manner, such as, for example, using standard masking and etching techniques. In embodiments, the trench feature 72 is formed substantially in the shape of a "dog-bone" as described above, although other shapes are contemplated for use with the invention.

Figure 7C:
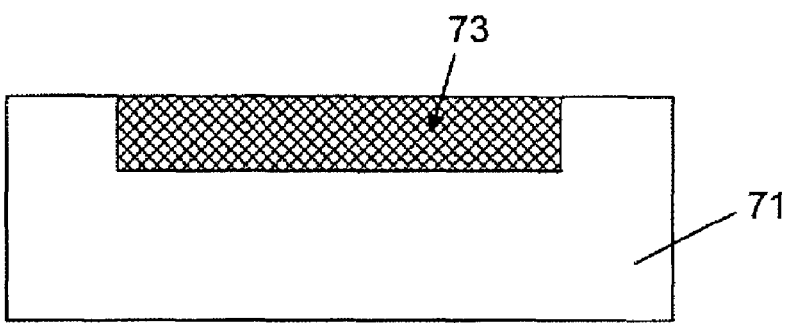

As depicted in FIG. 7C, fuse element material 73 is deposited in the trench feature 72. This may be accomplished in any known manner. As described above, the fuse element material 73 may comprise silicon, silicon plus metal silicide, copper, copper alloy, aluminum, aluminum alloy, tungsten, etc.

Figure 7D:
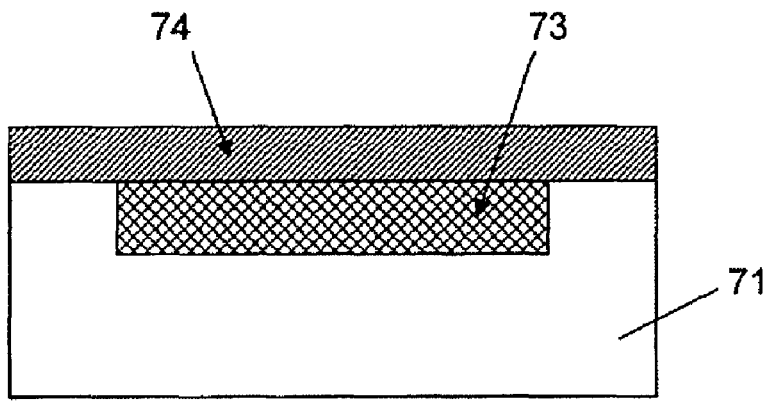

Next, as shown in FIG. 7D, liner material 74 is deposited over the fuse element material 73 and substrate 71. The liner material 74 may comprise metal (e.g., titanium, titanium nitride, tantalum, tantalum nitride, tungsten) or dielectric (e.g., silicon oxide, silicon nitride, silicon carbide, and nitrogen and/or hydrogen doped silicon carbide). In embodiments, the liner material 74 is deposited using plasma chemical vapor deposition (CVD). Compressive stress is imparted in the liner material 74 during deposition by controlling CVD process parameters including plasma power, chamber pressure, chamber temperature, and precursor flow rate. For example, relatively high plasma power generally causes increased compressive stress in nitride-based liners. In implementations, plasma power of about 800 W to 1500 W is used to impart stress magnitudes on the order of about −11 GPa to −13 GPa in nitride based liners.

In implementations of the invention, a second layer of liner material (not shown) may be deposited over the first layer of liner material 74. The second layer may also be deposited using plasma CVD, although different process parameters (e.g., plasma power, pressure, temperature, precursor flow rate, etc.) may be employed for depositing the second layer of liner material.

Figure 7E:
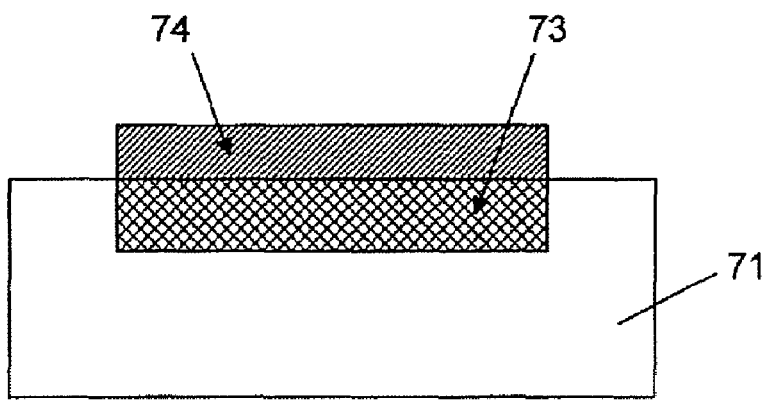
Figure 7F:
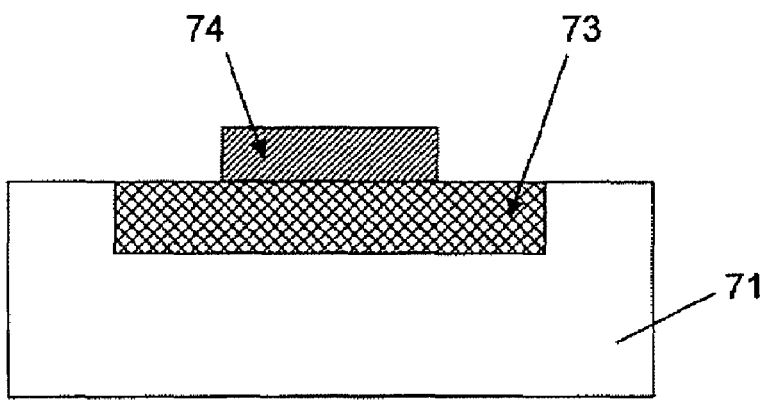

Lastly, the liner material 74 (and optionally included second layer of liner material) may be patterned to cover the entire fuse element as shown in FIG. 7E or just a portion thereof (e.g., the neck) as shown in FIG. 7F. The patterning may be accomplished in any known manner, such as, for example, photolithographic patterning and etching.

According to embodiments, the above-described process steps of making the fuse element may be implemented in front end of the line (FEOL), back end of the line (BEOL), or far back end of the line (FBEOL) processes. For example, when the fuse element is fabricated using the above-described process steps during FEOL stages, the fuse element may be composed of silicon-based materials. Furthermore, when the fuse element is fabricated using the above-described process steps during BEOL stages, the fuse element may be composed of copper-based materials (including alloys). Even further, when the fuse element is fabricated using the above-described process steps during FBEOL stages, the fuse element may be composed of aluminum-based materials (including alloys). In this manner, the fabrication of the fuse element is compatible with current process flow.

The semiconductor device as described above may be part of the design for an integrated circuit chip. In embodiments, the chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed:

1. A method of making a fuse for a semiconductor device, comprising:

forming a substrate;

forming a trench feature in the substrate;

depositing fuse material in the trench feature;

reducing electro-migration resistance of the fuse material by depositing compressive stress liner material over the fuse material; and patterning the compressive stress liner material, wherein the forming the trench feature comprises removing substrate material from the substrate in the shape of: first and second contact portions, and a neck connecting the first and second contact portions and having a cross-sectional area less than each of the first and second contact portions, the patterning comprises removing compressive stress liner material from the fuse material of the contact portions, the depositing compressive stress liner material over the fuse material comprises depositing one of one of titanium, titanium nitride, tantalum, tantalum nitride, tungsten, silicon oxide, silicon nitride, silicon carbide, nitrogen-doped silicon carbide, and hydrogen-doped silicon carbide, and the depositing compressive stress liner material over the fuse material comprises using plasma chemical vapor deposition and adjusting a compressive stress component of the compressive stress liner material by adjusting at least one of plasma power, chamber pressure, chamber temperature, and precursor flow rate.

* * * * *